United States Patent [19]

Hill et al.

[11] Patent Number: 4,955,026
[45] Date of Patent: Sep. 4, 1990

[54] FREQUENCY LOCKING RADIATION BEAM

[75] Inventors: Godfrey R. Hill, Ipswich; David W. Smith; David J. Hunkin, both of Woodbridge, all of England

[73] Assignee: British Telecommunications public limited company, London, United Kingdom

[21] Appl. No.: 107,594

[22] Filed: Nov. 12, 1987

[30] Foreign Application Priority Data

Jan. 28, 1986 [GB] United Kingdom ............... 8602015
Jan. 28, 1986 [GB] United Kingdom ............... 8602016

[51] Int. Cl.$^5$ .............................................. H01S 3/098
[52] U.S. Cl. ...................................... 372/18; 372/20; 372/32; 372/28
[58] Field of Search ................ 372/18, 32, 20, 28, 372/26, 29

[56] References Cited

U.S. PATENT DOCUMENTS

| | | | |
|---|---|---|---|
| 3,437,955 | 4/1969 | Enloe et al. | 372/32 |
| 3,471,803 | 10/1969 | Forster | 372/32 |
| 3,747,004 | 7/1973 | Sasnett | 372/18 |
| 4,096,448 | 6/1978 | Hayes | 372/18 |
| 4,181,898 | 1/1980 | McAllister | 372/18 |
| 4,237,427 | 12/1980 | Holland | 372/29 |
| 4,326,803 | 4/1982 | Lawrence | 356/350 |
| 4,329,664 | 5/1982 | Javan | 372/18 |
| 4,410,992 | 10/1983 | Javan | 372/32 |
| 4,468,773 | 8/1984 | Seaton | 372/32 |
| 4,635,246 | 1/1987 | Taylor et al. | 378/18 |
| 4,685,111 | 8/1987 | Baer | 372/29 |
| 4,751,705 | 6/1988 | Hadley et al. | 378/18 |
| 4,796,265 | 1/1989 | Asada et al. | 372/31 |
| 4,817,100 | 3/1989 | Cameron et al. | 372/32 |

OTHER PUBLICATIONS

Instruments and Experimental Techniques, vol. 22, No. 2, part 2, Mar./Apr. 1979, (N.Y., U.S.), V. G. Gol'dort et al.: "Wide-band unit for phase-frequency locking of lasers", see FIG. 2, pp. 557-562.
Instruments and Experimental Techniques, vol. 21, Nos. 1/2, Jan./Feb. 1978, (N.Y.), U.S.; V. G. Gol'dort et al.: "Wide-Band Tunable Laser Locking System", pp. 213-216, See FIG. 1.

Primary Examiner—Léon Scott, Jr.
Attorney, Agent, or Firm—Nixon & Vanderhye

[57] ABSTRACT

A method and apparatus for locking the frequencies of a number of first beams of coherent radiation from respective sources. Typically, the sources will form local oscillators in respective transmitters. The apparatus includes a reference beam generator such as a HeNe laser which generates a primary reference beam fed to an interferometer which generates a second, reference beam composed of a number of reference frequencies. This second reference beam is caused to interfere with each of the beams from the local sources in an optical coupler and the resultant beam is detected with a photodiode. The electrical output signal of the photodiode is filtered and fed to a discriminator which controls the frequency of the local laser. The discriminator controls the laser to maintain the relationship between the frequencies of the laser and the reference laser substantially constant.

13 Claims, 4 Drawing Sheets

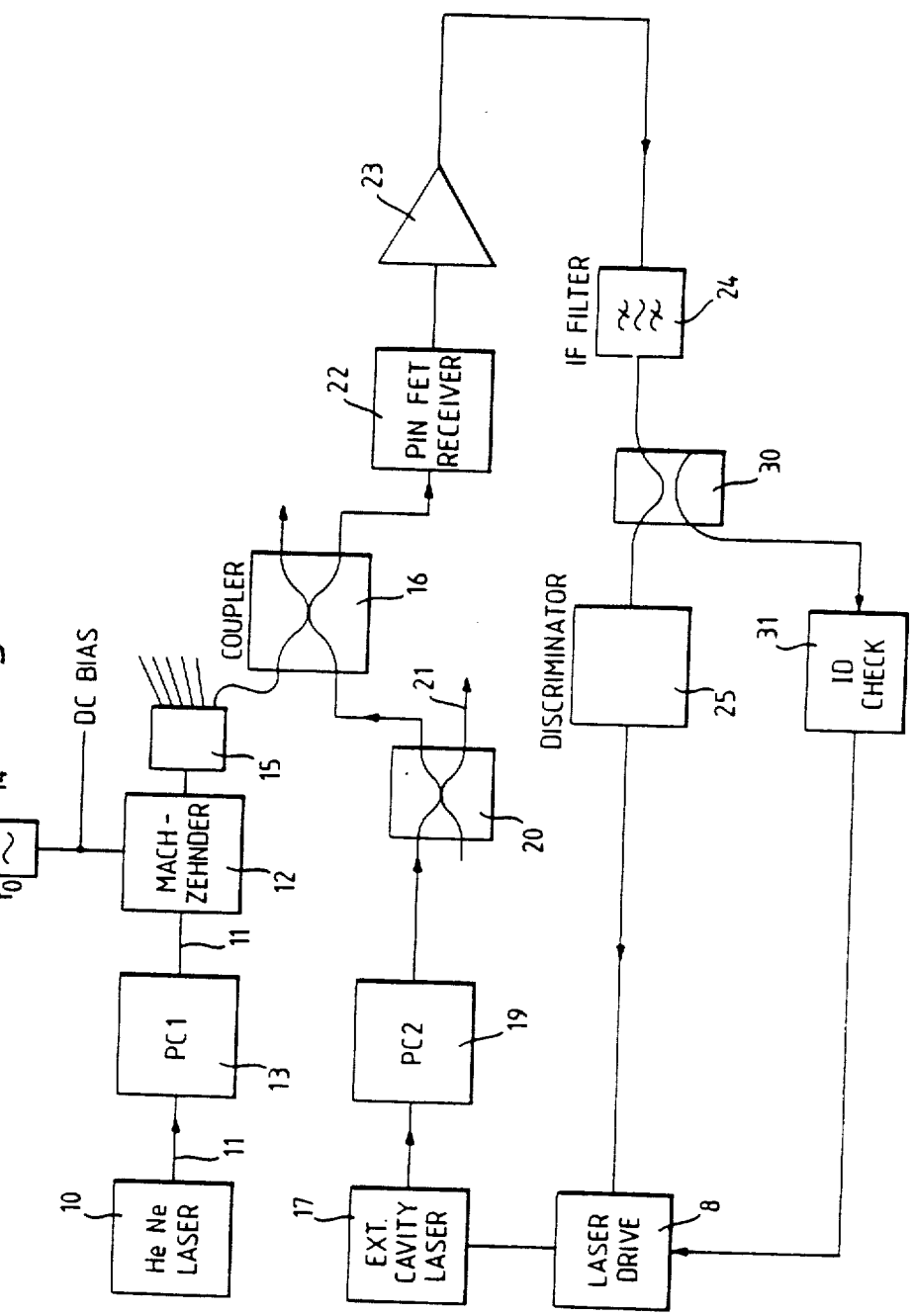

(a) LOWER 2ND HARMONIC (b) LOWER 1ST HARMONIC (c) FUNDAMENTAL (d) UPPER 1ST HARMONIC (e) UPPER 2ND HARMONIC

29Hz

HeNe    EXT. CAV

29Hz

FREQUENCY LOCKING RADIATION BEAM

The invention relates to methods and apparatus for locking the frequencies of a number of beams of coherent radiation.

Optical communication systems are being developed which employ a closely spaced optical frequency multiplex. These systems offer the capability of carrying many optical information channels over a single optical waveguide such as an optical fibre or of carrying a number of channels in a narrow frequency band of the fibre. A frequency multiplex is formed from a number of laser transmitters operating at closely spaced frequencies and carried over a single fibre to a demultiplexer. The individual channels can be detected using tunable heterodyne receivers or, possibly, simple optical filters.

In order to maximise the number of channels available, it is important that the laser frequencies are precisely controlled.

In order to deal with this problem, and in accordance with one aspect of the present invention, a method of locking the frequencies of a number of first beams of coherent radiation comprises generating a second, reference beam of coherent radiation composed of a number of reference frequencies; monitoring the relationship between the frequency of each first beam and a respective one of the reference frequencies; and modifying the first beam frequencies to maintain the monitored relationships substantially constant.

In accordance with a second aspect of the present invention, apparatus for locking the frequencies of a number of first beams of coherent radiation comprises a reference beam generator for generating a second, reference beam of coherent radiation composed of a number of reference frequencies; monitoring means for monitoring the relationship between the frequency of each first beam and a respective one of the reference frequencies and for generating corresponding control signals; and modifying means responsive to the control signals for modifying the first beam frequencies to maintain the monitored relationships substantially constant.

The invention solves the problems mentioned above by locking each first beam of radiation with a respective reference frequency, the reference frequencies being provided by a reference beam of coherent radiation.

There are a number of ways in which the monitoring step could be carried out. For example the reference beam of coherent radiation could be split into a number of subsidiary beams each of which is then filtered to remove all but one of the reference frequencies so that each subsidiary beam is composed of a single frequency or small band of frequencies.

Preferably, however, the monitoring step comprises splitting the reference beam into a number of subsidiary reference beams, causing each first beam to interfere with a respective one of the subsidiary beams to generate respective intermediate beams composed of a number of intermediate frequencies, and for each intermediate beam monitoring one of the intermediate frequencies, and wherein the modifying step comprises modifying the first beam frequencies to maintain the monitored intermediate frequencies substantially constant.

In the case of optical radiation, the reference beam may be split using a conventional optical fibre coupler, a planar waveguide coupler, or a prism beam splitter. Thus, conveniently the monitoring means comprises a beam splitter for splitting the reference beam into a number of subsidiary reference beams, coupling means for causing each first beam to interfere with a respective one of the subsidiary beams whereby respective intermediate beams composed of a number of intermediate frequencies are generated, and sensing means for sensing one of the intermediate frequencies in each intermediate beam and for generating the control signal relating to the sensed intermediate frequency.

The first beam frequencies may be modified either by controlling the sources of the beams, such as lasers, or by causing the beams to pass through respective frequency modulators which are controlled by the control signal generated by the sensing means.

The second, reference beam of coherent radiation provides a "comb" of reference frequencies which preferably are equally spaced about a primary reference frequency. Conveniently, such a reference beam may be generated by modulating one or more primary reference beams of coherent radiation with a rf signal whereby the number of reference frequencies are generated.

Examples of suitable reference beam generators include a Mach-Zehnder device or an optical phase modulator to which a primary reference beam is fed. In either case, the device is driven by an RF signal so as to produce a corresponding modulation.

In the case where each first beam interferes with the reference beam composed of the reference frequencies, a number of intermediate frequencies will result. It is desired to lock each first beam with a different one of the reference frequencies and so it is convenient to identify the reference frequency responsible for each intermediate frequency. This may conveniently be achieved if the modulated reference beam is further modulated with a relatively low frequency whereby the frequencies of the intermediate beams are subject to different deviations depending upon the reference frequency involved; and wherein the monitoring step comprises monitoring the intermediate frequency With a desired deviation.

This additional modulation may be achieved by modulating the RF signal before it is used to modulate the primary reference beam. Alternatively, the primary reference beam could be modulated by the RF signal and a further modulating signal at spaced positions.

The RF modulating signal is periodic and may have for example a sine wave form or could comprise a pulse train. Alternatively, two or more sine wave signals could be combined to constitute the modulating signal.

The reference beam source may comprise a suitably stable laser such as HeNe laser for the 1.5 $\mu$m band, a Nd-YAG laser for the 1.3 $\mu$m band, or a semiconductor laser locked to a suitable atomic standard such as an absorbtion line.

Although the invention is particularly applicable in the optical domain, it may also be used in certain non-optical wavebands. In this specification the term optical is intended to refer to that part of the electro-magnetic spectrum which is generally known as the visible region together with those parts of the infra-red and ultra-violet regions at each end of the visible region which are capable of being transmitted by dielectric optical waveguides such as optical fibres.

It should be understood that by "coherent" we mean, in the context of communication systems, that the beam linewidth is small compared with the information modulation bandwidth.

It should also be appreciated that references to "frequency" may be replaced by references to "wavelength" account being taken of the inverse relationship between them.

An example of an optical communication system incorporating frequency locking apparatus for carrying out methods according to the invention will now be described with reference to the accompanying drawings, in which:

FIG. 2 is a block diagram of part of the frequency locking apparatus;

Figure 1:
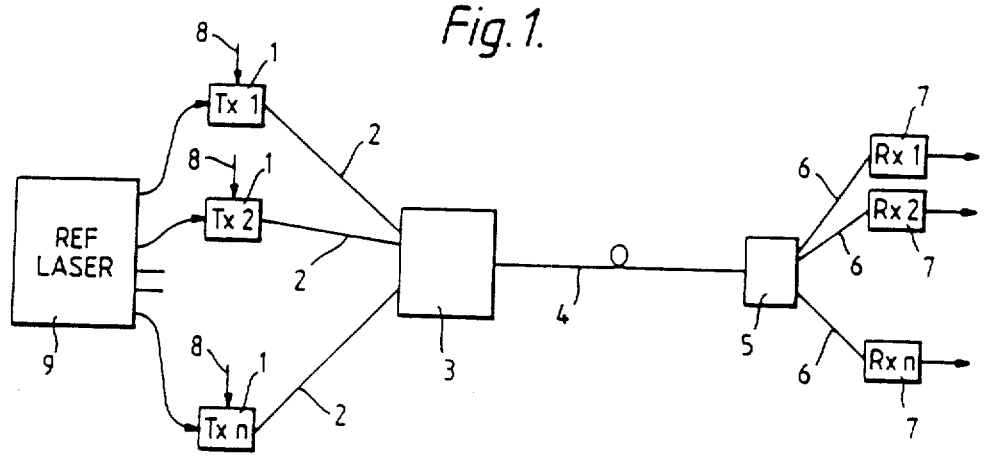
FIG. 1 is a block diagram of the communication system.

An optical communication network incorporating an example of a frequency locking system according to the invention is illustrated schematically in FIG. 1. The communication system includes a number n of transmitters 1 connected by optical fibres 2 to an optical combiner or multiplexer 3. Optical signals from the optical fibres 2 are frequency division multiplexed by the multiplexer 3 onto a single optical fibre 4 connected to a remote optical splitter or demultiplexer 5. The demultiplexer 5 divides the incoming signals onto a number of optical fibres 6 each of which is connected to a respective receiver 7. Each receiver 7 has a local oscillator to enable the incoming signal to be detected and converted to an electrical, demodulated information signal in a conventional manner.

Each transmitter 1 also includes a local laser or oscillator whose output signal is modulated by an information signal indicated by arrows 8.

In this type of network it is necessary that the frequencies of the local lasers in the transmitters 1 are precisely controlled. To this end, a reference laser 9 is provided. This is shown in more detail in FIG. 2. (In other arrangements a reference laser system could be used in which a number of reference lasers are used with their outputs multiplexed together in place of the laser 9. Their wavelengths may be spaced apart at 100 GHz intervals.) The reference laser is a HeNe laser 10 which operates at 1.523 μm and is coupled by optical fibres 11 to a LiNbO$_3$ waveguide Mach-Zehnder interferometer 12 via a mechanical polarisation controller 13. The interferometer 12 consists of two phase modulators arranged in parallel with Y-junctions at input and output. A RF source 14 is provided to supply RF signals at a frequency $f_0$ to the interferometer 12. If the input Y-junction splits the incident power ($f_R$) equally, the device is modulated at a frequency $f_0$ with phase modulation depth, $\phi_1$ and there is a dc phase difference $\phi_0$ between the two signals when they recombine at the output Y-junction then it can be shown that, in general, optical signals are generated at frequencies $f_R \pm nf_0$ which have intensities proportional to:

$$I(f_R \pm nf_0) \propto J_n^2(\phi_0)[1 + (-1)^n \cos \phi_0]$$

where $J_n$ is the Bessel coefficient of the first kind with order n. By careful adjustment of the input polarisation, (PC1), rf power and dc bias a comb of frequencies can be generated consisting of the fundamental along with the first, second, third harmonics etc on either side.

Figure 3:
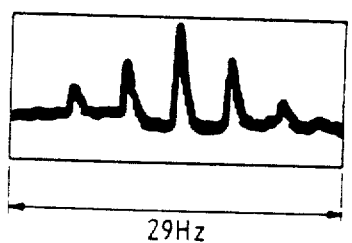
FIGS. 3–5 illustrate the signals at different positions in the FIG. 2 apparatus.

In one case the modulating signal was 420 MHz at +28 dBm and the dc bias was adjusted to about 7 v to give the spectrum shown in FIG. 3 measured on a scanning etalon type optical spectrum analyser directly at the output of the Mach-Zehnder 12.

The interferometer 12 thus represents a comb generator.

The comb of frequencies from the interferometer 12 is fed to an optical power splitter 15 so that a proportion of the incoming beam is fed to each of the transmitters 1 shown in FIG. 1. For simplicity, FIG. 2 shows just one of the transmitters 1 in more detail.

Each transmitter 1 includes an optical coupler 16 to which the incoming signal from the reference laser system 9 is fed. The local laser of the transmitter 1 is an external cavity laser 17 consisting for example of an InGaAsP diode laser, antireflection-coated on one facet, coupled into a 10 cm external cavity containing a 1200 line/mm diffraction grating and a silica plate which allows fine adjustment of the cavity length under the control of a drive unit 18.

The output of the laser 17 is fed via a polarisation controller 19 to an optical splitter 20. A proportion of the laser beam is fed by the splitter 20 to conventional information modulating means (not shown) along an optical fibre 21 for transmission subsequently to the multiplexer 3. The remaining portion is fed to a second input port of the optical coupler 16 where it is combined with the reference beam from the splitter 15. A proportion of the combined signal is fed to a PINFET photodiode receiver 22. Polarisation controller 19 is adjusted to ensure matched polarisation at the receiver 22.

The result of the coupling carried out by the coupler 16 is that the signal from the laser 17 is combined with each of the comb frequencies and, if the receiver bandwidth is large enough, this produces a number of intermediate frequencies (IF). These intermediate frequencies are amplified by an amplifier 23 and fed to an IF filter 24. A portion of the output from the filter 24 is fed to a path delay frequency discriminator 25 whose output signal controls the drive circuit 18 via a splitter 30. Thus, the filter 24 and discriminator 25 form a frequency locked loop with the drive circuit 18 and the optical path from the laser 17.

The frequency to which the laser 17 is locked is determined by the setting of the filter 24.

Figure 4:
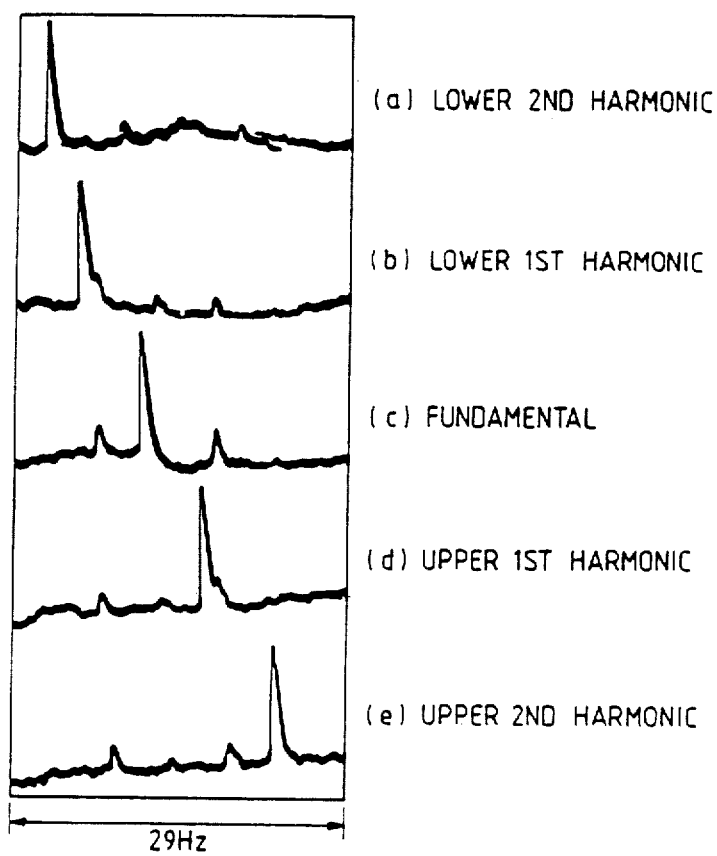
Figure 6:
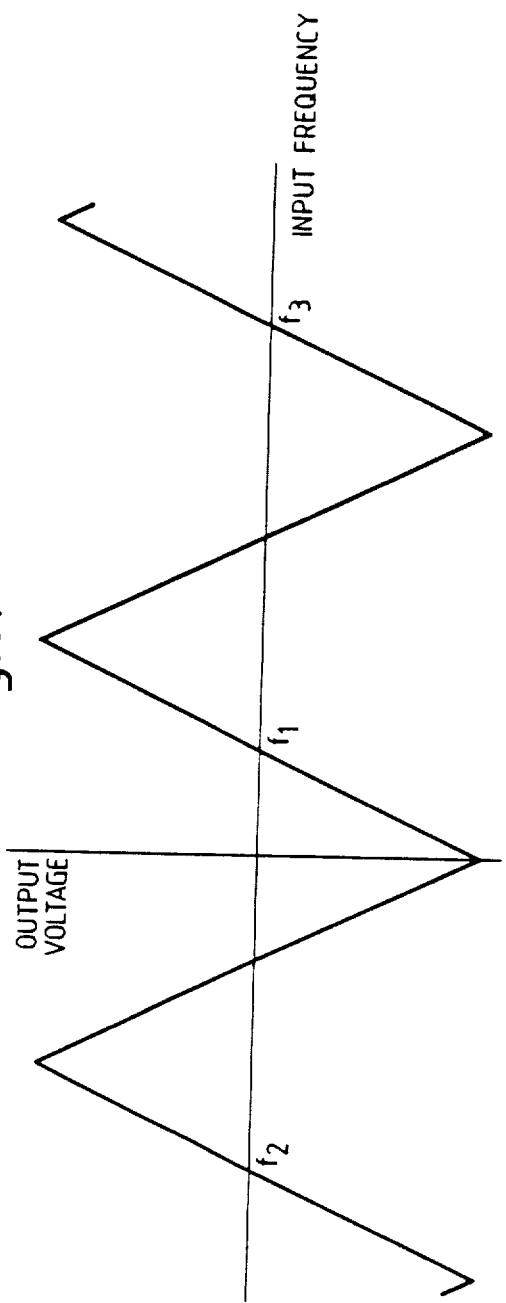
FIG. 6 illustrates the response of the discriminator shown in FIG. 2 with frequency; and, FIG. 7 illustrates the application of an identification modulation to the reference frequencies.

In an experiment to test the arrangement shown in FIG. 2, the position of the diffraction grating associated with the laser 17 was adjusted to bring the external cavity laser wavelength close to each tooth of the comb in turn and then the frequency locked loop was closed in each case to allow locking to occur. A five tooth comb with 420 MHz spacing was used, and the IF was initially set to 100 MHz. FIG. 4 shows the scanning etalon trace for the fundamental and first and second harmonics on either side. The system losses in the experimental arrangement precluded locking to the third harmonics. Locking was stable and could be maintained for several hours if left undisturbed. The frequency jitter introduced by the control loop was 5 MHz for the fundamental, 6 MHz for the first harmonics and 7 MHz for the second harmonics, being largely determined by the IF amplitude. In principle the external cavity laser could be locked on either side of each tooth to yield the same IF but, in this case, this was prevented since the discriminator has a replicated characteristic with locking points asymmetrically disposed about 0 Hz as shown in FIG. 6. $f_1$ was measured as +102 MHz, $f_2$ as −327

Figure 5:
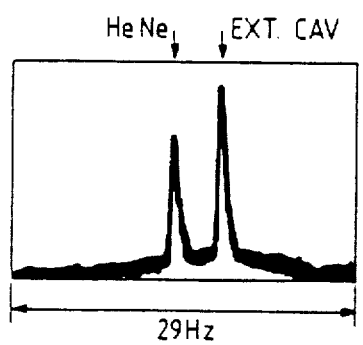

MHz and $f_3$ as +535 MHz. Since $f_2$ and $f_3$ fall outside the IF filter bandwidth then locking can only occur at IF=$f_1$. By changing the IF filter to one centred at 320 MHz it was possible to lock to the fundamental with a 327 MHz offset as shown in FIG. 5. The characteristic of the discriminator 25 can be exploited to enable small offset frequencies to be achieved by changing the centre frequency of the filter 24. This allows the frequency control loop to lock to a different IF. If the discriminator 25 is designed so that the spacing between successive IF's is small with respect to the optical comb spacing then this technique could be used to fine step tune between the teeth of the optical comb. A degree of continuous fine tuning, possibly centred on these fine steps, can be achieved by adjusting the point on each slope at which each loop lock occurs.

The control loop needs to know which tooth of the comb it is locking on to. This could be achieved by determining the position of the tooth relatively to the fundamental. Alternatively, some form of identification can be used on each tooth. This may be achieved by modulating the offset signal $f_0$, for example, with a low frequency modulation signal ($f_M$) The deviation appearing on each tooth (FIG. 7) of the comb (within each side band) will be different, the deviation increasing as the order of the product increases. This may be detected in the control loop by guiding a portion of the output of the discriminator filter 24 via the splitter 30 to an ID checking circuit 31. If a simple detector is to be used, the deviation must be large compared to the jitter generated by the control loop. It must also be small compared to the modulating signal frequency in the channel it will eventually serve. If the deviation cannot be large compared to the loop jitter then a correlation receiver would be needed to detect the low frequency modulation.

The output signal from the circuit 31 acts as a coarse tune while the output from the discriminator 25 is a fine tune.

The communication system shown in FIG. 1 has a fairly simple structure and the invention may be used with more complex communication systems. For example, the output signals from the reference laser system 9 could be fed additionally to the receivers 7 either by being multiplexed onto a separate fibre (not shown) or by being multiplexed onto the fibre 4 with the transmitted signals. Furthermore, a two way communication system could be used if transmitters (not shown) are associated with the receiver 7. In this case, these transmitters could lock onto reference frequencies transmitted to them from the reference laser system 9.

A complication which arises is that for a given order product both upper and lower sidebands of the comb will exhibit similar frequency deviation and so an ambiguity remains. Furthermore the loop could lock with the controlled laser 17 above or below the selected product. This could be overcome by providing the circuitry around the control loop to examine the position and deviation of the adjacent products.

Figure 7:
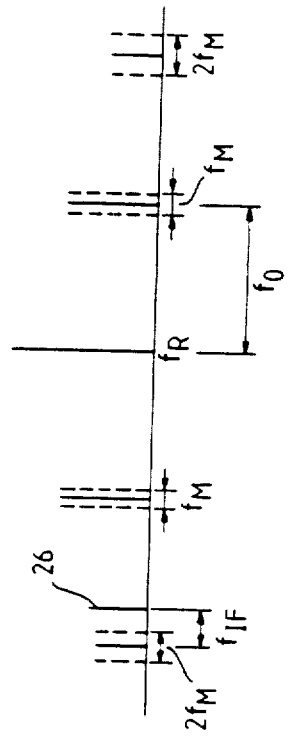

FIG. 7 also indicates an example of a channel frequency 26 offset from a reference tooth by a frequency $F_{IF}$. The channel frequency is given by:

$$f_R - 2f_o + f_{IF}.$$

We claim:

1. A method of locking the frequencies of a plurality of first beams of coherent radiation at respective different and closely spaced frequencies, the method comprising:
   generating a first beam of coherent radiation from each of a plurality of first sources of coherent radiation to produce a plurality of first beams having associated first beam frequencies;
   generating a reference beam of coherent radiation composed of a plurality of reference frequencies, each reference frequency having a different value, and being spaced apart from each other reference frequency by a predetermined amount;
   monitoring the difference between each first beam frequency and a respective one of the reference frequencies; and
   modifying each of the first beam frequencies to maintain predetermined differences with respect to respective reference frequencies substantially constant, thereby locking each first beam at a frequency which differs from the frequency of each other first beam.

2. A method according to claim 1 wherein:
   the monitoring step comprises splitting the reference beam into a number of subsidiary reference beams, causing each first beam to interfere with a respective one of the subsidiary beams to generate respective intermediate beams composed of a number of intermediate frequencies each having a respective signal level, and, for each intermediate beam monitoring one of the intermediate frequencies, and
   the modifying step comprises modifying the first beam frequencies t maintain the signal level of the monitored intermediate frequencies substantially constant.

3. A method according to claim 2, wherein the second reference beam of coherent radiation is generated by modulating a primary reference beam of coherent radiation with a rf signal to provide intermediate beams whereby the number of reference frequencies are generated.

4. A method according to claim 3, wherein:
   the or each modulated reference beam is further modulated with a relatively low frequency whereby the frequencies of the intermediate beams are subject to different deviations depending upon the reference frequency involved; and
   the modifying step occurs provided the monitored intermediate frequencies include a desired deviation.

5. A method according to any one of the preceding claims 1, 2, 3 or 4 wherein the beams of radiation comprise optical beams.

6. Apparatus for locking the frequencies of a plurality of first beams of coherent radiation at respective different and closely spaced frequencies, the apparatus comprising:
   a plurality of sources of coherent radiation for generating the plurality of first beams of coherent radiation each having a corresponding first beam frequency;
   a reference beam generator for generating a reference beam of coherent radiation composed of a plurality of reference frequencies, each reference frequency having a different value, and being spaced apart from each other reference frequency by a predetermined amount;
   monitoring means for monitoring the difference between the frequency of each first beam and a respective one of the reference frequencies and for generating corresponding control signals; and modifying means responsive to the control signals for modifying each first beam frequency to maintain predetermined differences with respect to respective reference frequencies substantially constant, thereby locking each first beam at a frequency which differs from the frequency of each other first beam.

7. Apparatus according to claim 6, wherein the monitoring means comprises:

a beam splitter for splitting the second reference beam into a number of subsidiary reference beams, coupling means for causing each first beam to interfere with a respective one of the subsidiary beams whereby respective intermediate beams composed of a number of intermediate frequencies are generated, and sensing means for monitoring respective ones of the intermediate frequencies in generating the control signals in response thereto.

8. Apparatus according to claim 6 or claim 7 wherein the reference beam generator comprises a primary reference beam source, a RF signal source, and a modulator to which the primary reference beam is fed for modulation by the RF signal.

9. Apparatus according to claim 8 wherein said modulator comprises an optical comb generator.

10. Apparatus according to claim 9 further comprising a number of first sources for generating the first radiation beams, the first sources responding to the control signals generated by the monitoring means to adjust the frequencies of the respective first beams.

11. Apparatus according to any one of claims 6 or 7, further comprising a number of first sources for generating the first radiation beams, the first sources responding to the control signals generated by the monitoring means to adjust the frequencies of the respective first beams.

12. A method for simultaneously stabilizing and maintaining respectively different operating frequencies for plural laser sources of coherent radiation, said method comprising the steps of:

generating a plurality of coherent optical reference signals collectively defining a comb of amplitude versus frequency reference signals having stably maintained frequency differences therebetween; and locking a frequency control circuit associated with each of said laser sources onto a respectively different one of said reference signals.

13. A system of plural laser sources of coherent radiation simultaneously stabilized to operate on respectively different operating frequencies, said system comprising:

a comb source of plural optical reference signals having stabilized frequency differences therebetween; and a frequency control circuit associated with each of said lasers and adapted to lock onto a respectively different one of said reference signals.

* * * * *